US008431209B2

(12) United States Patent
Bletsos et al.

(10) Patent No.: US 8,431,209 B2
(45) Date of Patent: Apr. 30, 2013

(54) BREATHABLE LOW-EMISSIVITY METALIZED SHEETS

(75) Inventors: Ioannis V Bletsos, Midlothian, VA (US); Edmee Lydie Marie-Jeanne Devaquet, Howald (LU); Michael G Mikhael, Tucson, AZ (US); Jose Manuel Rodrigues-Parada, Hockess, DE (US); Angelo Yializis, Tucson, AZ (US); Joseph Anthony King, Jr., Midlothian, VA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/977,640

(22) Filed: Oct. 25, 2007

(65) Prior Publication Data
US 2008/0187740 A1  Aug. 7, 2008

Related U.S. Application Data

(62) Division of application No. 10/924,218, filed on Aug. 23, 2004, now abandoned.

(51) Int. Cl.
*B32B 3/24* (2006.01)

(52) U.S. Cl.
USPC ............... 428/137; 428/596; 442/76; 442/77; 442/230; 442/379

(58) Field of Classification Search .................. 428/137, 428/596; 442/76, 77, 230, 379
See application file for complete search history.

(56) References Cited

U.S. PATENT DOCUMENTS

| 3,081,519 A | 3/1963 | Blades et al. |
| 3,169,899 A | 2/1965 | Steuber |
| 3,227,784 A | 1/1966 | Blades et al. |
| 3,646,749 A | 3/1972 | Clough et al. |
| 3,660,138 A | 5/1972 | Gorrell |
| 3,851,023 A | 11/1974 | Brethauer et al. |
| 4,268,541 A | 5/1981 | Ikeda et al. |
| 4,467,005 A | 8/1984 | Pusch et al. |
| 4,508,776 A | 4/1985 | Smith |
| 4,537,811 A | 8/1985 | Nablo |
| 4,557,957 A | 12/1985 | Manniso |

(Continued)

FOREIGN PATENT DOCUMENTS

| EP | 0 722 787 B1 | 6/2002 |
| EP | 1 245 720 A1 | 10/2002 |

(Continued)

OTHER PUBLICATIONS

A. Ylalizis et al., "Vacuum Surface Functionalization of Paper and Woven or Nonwoven Materials", 2003 Society of Vacuum Coaters 505/856-7188, 46th Annual Technical Conference Proceedings, ISSN 0737-5921, 2003, pp. 1-7.

*Primary Examiner* — William P Watkins, III

(57) ABSTRACT

A moisture vapor permeable metalized composite sheet is formed by coating a moisture vapor permeable sheet with at least one metal layer and at least one outer organic coating layer. The moisture vapor permeability of the composite sheet is at least about 80% of the moisture vapor permeability of the starting sheet. The composite sheet provides a barrier to air and liquid water infiltration while having high moisture vapor permeability and good thermal barrier properties. The composite sheet material is suitable for use as a building construction wrap such as roof lining and house wrap.

18 Claims, 7 Drawing Sheets

U.S. PATENT DOCUMENTS

| | | |
|---|---|---|
| 4,560,608 A | 12/1985 | Pusch et al. |
| 4,567,098 A | 1/1986 | Becker et al. |
| 4,621,012 A | 11/1986 | Pusch |
| 4,645,704 A | 2/1987 | Hellwig |
| 4,739,012 A | 4/1988 | Hagman |
| 4,816,124 A | 3/1989 | Manabe et al. |
| 4,842,893 A | 6/1989 | Yializis et al. |
| 4,868,062 A | 9/1989 | Hoeschele et al. |
| 4,911,811 A * | 3/1990 | Mullaney, Jr. ........... 204/192.14 |
| 4,954,371 A | 9/1990 | Yializis |
| 4,974,382 A | 12/1990 | Avellanet |
| 4,999,222 A | 3/1991 | Jones et al. |
| 5,032,461 A | 7/1991 | Shaw et al. |
| 5,055,338 A | 10/1991 | Sheth et al. |
| 5,120,585 A | 6/1992 | Sutter et al. |
| 5,134,831 A | 8/1992 | Avellanet |
| 5,316,837 A | 5/1994 | Cohen |
| 5,440,446 A | 8/1995 | Shaw et al. |
| 5,547,508 A | 8/1996 | Affinito |
| RE35,427 E | 1/1997 | Poettgen |
| 5,614,259 A | 3/1997 | Yang et al. |
| 5,725,909 A | 3/1998 | Shaw et al. |
| 5,955,175 A | 9/1999 | Culler |
| 6,066,826 A | 5/2000 | Yializis |
| 6,083,628 A | 7/2000 | Yializis |
| 6,231,939 B1 | 5/2001 | Shaw et al. |
| 6,268,695 B1 | 7/2001 | Affinito |
| 6,270,841 B1 | 8/2001 | Mikhael et al. |
| H2000 H | 11/2001 | Middlesworth et al. |
| 6,322,859 B1 | 11/2001 | Pluim et al. |
| 6,660,339 B1 | 12/2003 | Datta et al. |
| 2002/0142684 A1 | 10/2002 | Miska |
| 2003/0136078 A1 | 7/2003 | Brown et al. |
| 2004/0213918 A1 | 10/2004 | Mikhael et al. |
| 2007/0166528 A1 | 7/2007 | Barnes et al. |

FOREIGN PATENT DOCUMENTS

| | | |
|---|---|---|
| EP | 0 758 482 B1 | 3/2003 |
| EP | 1 400 348 A2 | 3/2004 |
| WO | WO 98/12494 | 3/1998 |
| WO | WO 98/18852 A1 | 5/1998 |
| WO | WO 99/58757 A1 | 11/1999 |
| WO | WO 99/59185 A1 | 11/1999 |
| WO | WO 01/28770 A1 | 4/2001 |
| WO | WO 2004/001770 A1 | 2/2004 |
| WO | WO 2004/017701 A2 | 2/2004 |

* cited by examiner

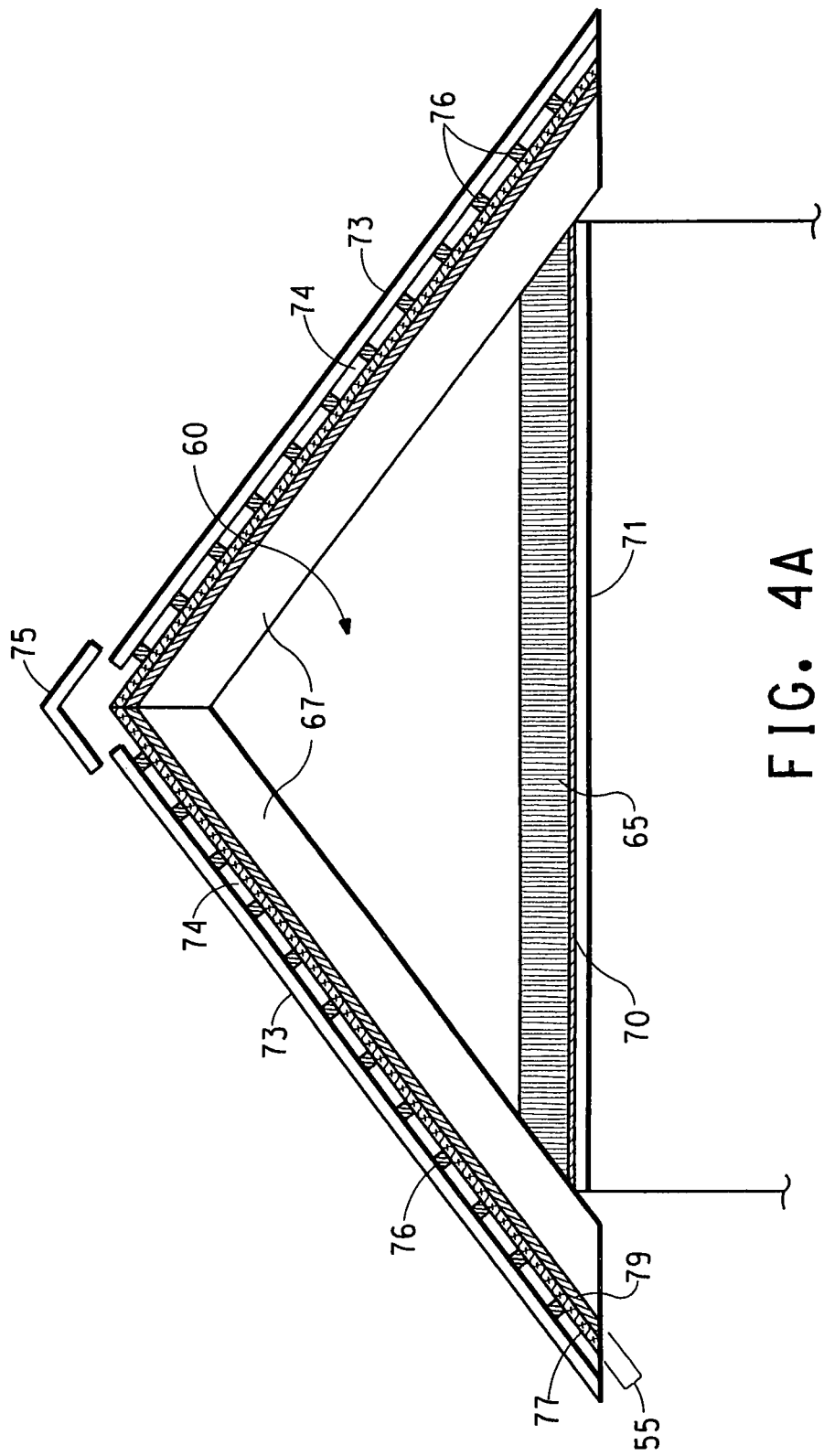

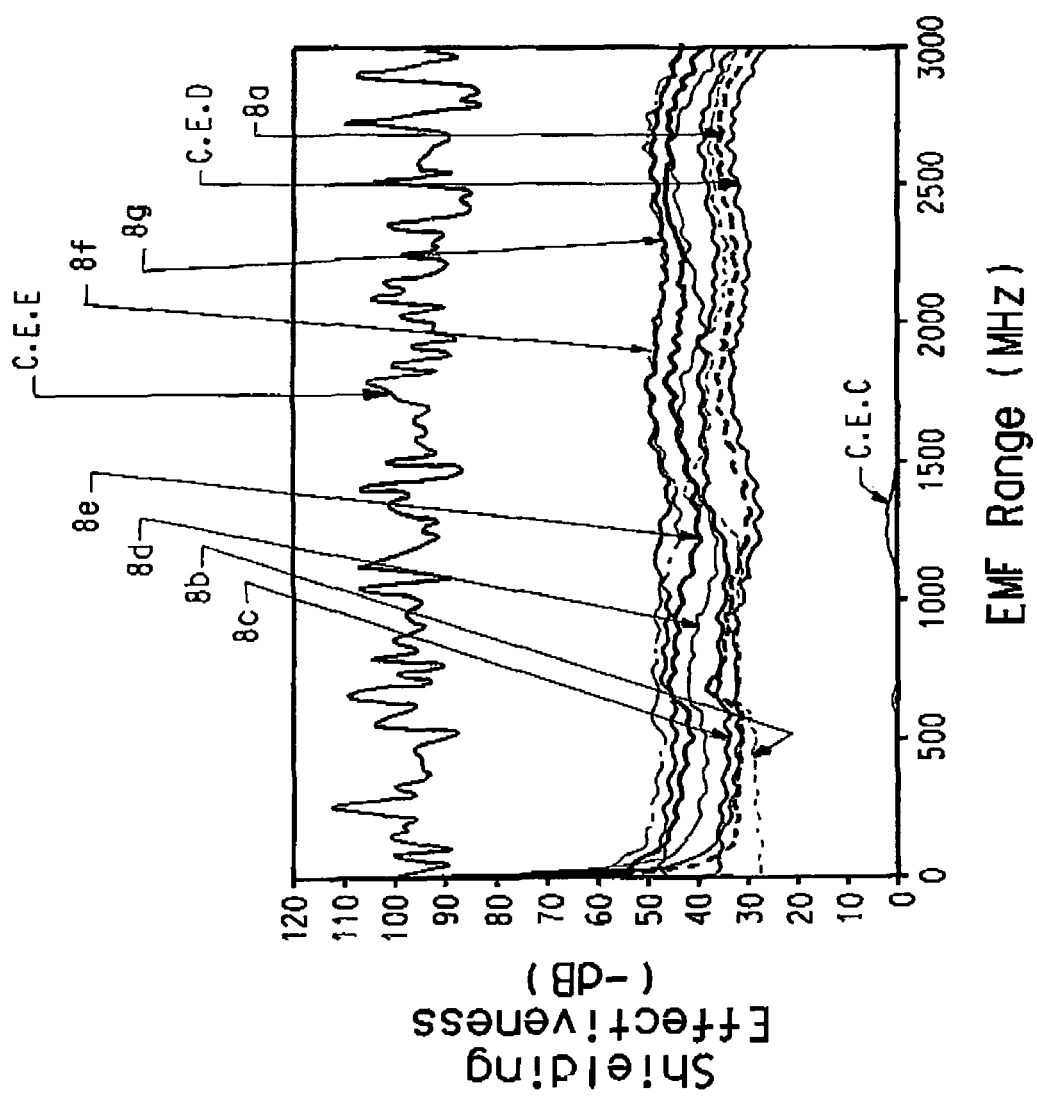

BREATHABLE LOW-EMISSIVITY METALIZED SHEETS

BACKGROUND OF THE INVENTION

1. Field of the Invention

The present invention relates to metalized sheets having improved moisture vapor permeability and thermal barrier properties suitable for use as thermal barriers in building construction.

2. Description of the Related Art

It is known in the art to use moisture vapor permeable (breathable) metalized sheets as house wrap in building construction. The metalized sheets allow moisture vapor to pass through the sheet, thus preventing moisture condensation in insulation that is installed behind the sheet, while at the same time providing a barrier to air and liquid water and enhancing the energy efficiency of the building. U.S. Pat. No. 4,999,222 to Jones et al. describes moisture vapor permeable metalized polyethylene sheets with low emissivity prepared by calendering a plexifilamentary film-fibril sheet followed by vacuum metallization. U.S. Pat. No. 4,974,382 to Avellanet describes an infiltration and energy barrier that can be vapor permeable or impermeable having at least one metalized layer thereon. Published PCT International Application No. WO 01/28770 to Squires et al. describes breathable building membranes that include an under layer of microporous film and a top layer formed of a filamentous polymeric fabric, for example a spunbond fabric, which is provided with a moisture vapor permeable reflective metal coating. While the breathable metalized sheets described above provide a thermal barrier by reflecting infrared radiation, they are susceptible to oxidation of the metal layer upon exposure to air and moisture. An oxidized metal layer generally has a higher emissivity than the corresponding metal and is less effective as a thermal barrier. In addition, a thin exposed metal layer can be damaged during processing, installation, etc.

Published European Patent Application No. EP 1400348 to Avril et al. describes liquid impermeable, moisture vapor/gas permeable laminated fabrics that are suitable for use as construction fabrics such as house wrap and roofing underlay that include a reflective film layer formed by vapor depositing a metal layer on a first polymeric film layer and sandwiching the metal layer between the first polymeric film layer and a second polymeric film layer. The film layers protect the metal layer from damage during use, but are moisture impermeable and are microperforated after metallization to provide the desired moisture vapor permeability.

Metalized nonwovens that have been coated with an organic polymer are also known for construction end uses, such as house wrap. However, the polymeric coating is applied using methods that significantly reduce the moisture vapor permeability compared to the uncoated metalized nonwoven sheet. U.S. Patent Application Publication No. 2003/0136078 to Brown et al. describes a method of insulating a building that includes the step of introducing an insulating membrane comprising a reflective layer and a breathable textile layer into the cavity between the outer cladding layer and the frame. The metalized layer may optionally be coated with a protective layer of plastic or varnish to protect the metal surface.

When a moisture vapor permeable sheet is coated over substantially an entire surface using conventional methods such as air knife coating, flexographic printing, gravure coating, etc., the coating reduces the moisture vapor permeability of the sheet. If the starting sheet has an open structure and is highly air permeable, the sheet can retain sufficient moisture vapor permeability after coating to be useful in certain end uses, such as apparel. For example, fabrics described in U.S. Pat. No. 5,955,175 to Culler are both air permeable and moisture vapor permeable after being metalized and coated with an oleophobic coating. However, when the starting moisture vapor permeable sheet has a highly closed structure with very low air permeability, such as nonwoven and other sheets used as house wrap or roof lining in the construction industry, conventional coatings result in significant covering of the pores on the surface of the sheet. This results in a coated sheet having significantly lower moisture vapor permeability than the starting sheet. This is undesirable in house wrap and roof lining products, which are desirably permeable to moisture vapor while at the same time forming a barrier to infiltration by air and liquid water.

It would be desirable to provide metalized sheets that have high barrier to liquid water, high moisture vapor permeability, and good thermal barrier properties for construction uses such as house wrap and roof lining.

BRIEF SUMMARY OF THE INVENTION

According to a first embodiment, the present invention is directed to a metalized composite sheet comprising a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics, and at least one multi-layer coating on said first outer surface of the sheet layer, said multi-layer coating comprising a first metal coating layer having a thickness between about 15 nanometers and 200 nanometers adjacent the first outer surface of the sheet layer, and an outer organic coating layer of a composition containing a material selected from the group consisting of organic polymers, organic oligomers and combinations thereof, having a thickness between about 0.2 micrometer and 2.5 micrometers deposited on the metal layer, wherein the moisture vapor transmission rate (MVTR) of the composite sheet is at least about 80% of the MVTR of the sheet layer measured prior to depositing the metal and coating layers.

In an alternative embodiment, the metalized composite sheet of the present invention can have a multi-layer coating which further comprises an intermediate organic coating layer of a composition containing a material selected from the group consisting of organic polymers, organic oligomers and combinations thereof, having a thickness between about 0.02 micrometer and 2 micrometers, deposited on the first outer surface of the moisture vapor permeable sheet layer between the sheet layer and the metal coating layer, wherein the total combined thickness of the intermediate and outer organic coating layers is no greater than about 2.5 micrometers.

Another embodiment of the present invention is directed to a metalized composite sheet comprising a porous flash spun plexifilamentary sheet layer having first and second outer surfaces, and at least one multi-layer coating comprising a metal coating layer having a thickness between about 15 nanometers and 200 nanometers deposited on the first outer surface of the flash spun plexifilamentary sheet layer, said metal selected from the group consisting of aluminum, silver, copper, gold, tin, zinc, and their alloys, and an outer organic coating layer of a composition containing a cross-linked polyacrylate having a thickness between about 0.2 micrometer and 1 micrometer deposited on the metal layer, wherein the multi-layer coating substantially covers the outer surface of the flash spun plexifilamentary sheet while leaving the pores substantially uncovered.

Another alternative embodiment of the present invention is directed to a metalized composite sheet comprising a porous flash spun plexifilamentary sheet layer having first and second outer surfaces, and at least one multi-layer coating comprising an intermediate organic coating layer of a composition containing a cross-linked polyacrylate having a thickness between about 0.02 micrometer and 1 micrometer deposited on the first outer surface of said flash spun plexifilamentary sheet layer, a metal coating layer having a thickness between about 15 nanometers and 200 nanometers deposited on said intermediate organic coating layer, said metal selected from the group consisting of aluminum, silver, copper, gold, tin, zinc, and their alloys, and an outer organic coating layer of a composition containing a cross-linked polyacrylate having a thickness between about 0.2 micrometer and 1 micrometer deposited on the metal layer, wherein the multi-layer coating substantially covers the outer surface of the flash spun plexifilamentary sheet while leaving the pores substantially uncovered.

BRIEF DESCRIPTION OF THE DRAWINGS

FIGS. 4A-4C are schematic diagrams of roof systems according to the present invention.

FIG. 6 is a plot of shielding effectiveness versus EMF frequency for composite sheets of Example 8 and incumbent metalized and unmetalized house wraps.

DETAILED DESCRIPTION OF THE INVENTION

Figure 1:
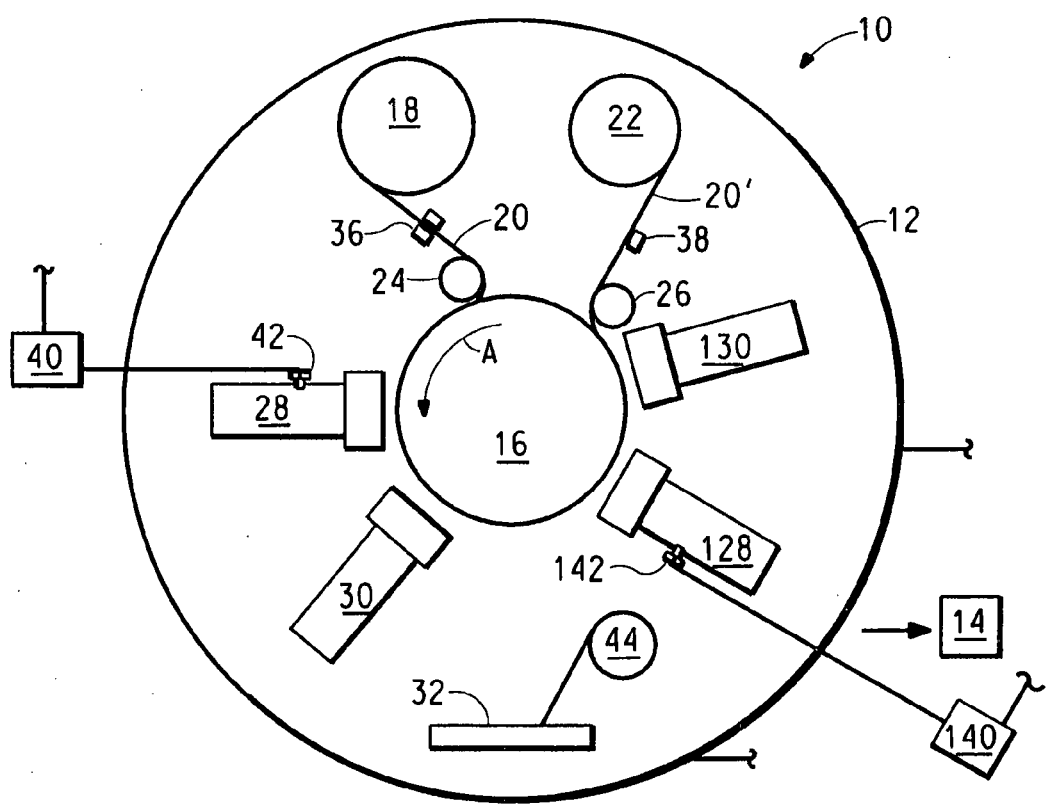
FIG. 1 is a schematic diagram of an apparatus suitable for forming a composite sheet of the present invention.

The terms "nonwoven fabric", "nonwoven sheet", "nonwoven layer", and "nonwoven web" as used herein refer to a structure of individual strands (e.g. fibers, filaments, or threads) that are positioned in a random manner to form a planar material without an identifiable pattern, as opposed to a knitted or woven fabric. The term "fiber" is used herein to include staple fibers as well as continuous filaments. Examples of nonwoven fabrics include meltblown webs, spunbond nonwoven webs, flash spun webs, staple-based webs including carded and air-laid webs, spunlaced webs, and composite sheets comprising more than one nonwoven web.

The term "woven sheet" is used herein to refer to sheet structures formed by weaving a pattern of intersecting warp and weft strands.

The term "spunbond fibers" as used herein means fibers that are melt-spun by extruding molten thermoplastic polymer material as fibers from a plurality of fine, usually circular, capillaries of a spinneret with the diameter of the extruded fibers then being rapidly reduced by drawing and then quenching the fibers.

The term "meltblown fibers" as used herein, means fibers that are melt-spun by meltblowing, which comprises extruding a melt-processable polymer through a plurality of capillaries as molten streams into a high velocity gas (e.g. air) stream.

The term "spunbond-meltblown-spunbond nonwoven fabric" ("SMS") as used herein refers to a multi-layer composite sheet comprising a web of meltblown fibers sandwiched between and bonded to two spunbond layers. Additional spunbond and/or meltblown layers can be incorporated in the composite sheet, for example spunbond-meltblown-meltblown-spunbond webs ("SMMS"), etc.

The term "plexifilamentary" as used herein, means a three-dimensional integral network or web of a multitude of thin, ribbon-like, film-fibril elements of random length and with a mean film thickness of less than about 4 microns and a median fibril width of less than about 25 microns. In plexifilamentary structures, the film-fibril elements are generally coextensively aligned with the longitudinal axis of the structure and they intermittently unite and separate at irregular intervals in various places throughout the length, width and thickness of the structure to form a continuous three-dimensional network. A nonwoven web of plexifilamentary film-fibril elements is referred to herein as a "flash spun plexifilamentary sheet".

As used herein, the term "tape" refers to a flattened strand, such as flattened strands formed from a slit film.

As used herein, the term "metal" includes metal alloys as well as metals.

The term "wall system" is used herein to refer a wall in a building construction. A wall system includes internal lining and outer skin layers, and other wall elements intermediate the internal lining and outer skin layers. The intermediate elements can include supporting frame elements such as vertical wooden studs, at least one air space, insulation material, optional vapor barrier layer, and a moisture vapor permeable metalized composite sheet of the present invention.

The term "roof system" is used herein to refer to a roof in a building construction. A roof system includes supporting roof frame elements such as pitched wooden rafters, external roofing material and other roof elements. Roof systems can be classified as warm roof systems and cold roof systems. In a cold roof system, the other roof elements can include optional vapor barrier layer, at least one air space (which can be the attic air space), elements intermediate the supporting roof frame elements and the external roofing material such as battens or solid sheathing, a moisture vapor permeable metalized composite sheet of the present invention, and insulation material installed at the floor level of the attic space, above the interior ceiling level. In a warm roof system, the other roof elements can include, in addition to those listed for a cold roof system, an attic ceiling and insulation installed above the attic ceiling (instead of at the floor level of the attic space). The other roof elements can be intermediate the supporting roof frame elements and the external roofing material, or attached to the side of the supporting roof frame elements facing towards the attic space, or installed between adjacent roof frame elements, etc., depending on the specific roof element.

In one embodiment, the present invention relates to metalized moisture vapor permeable composite sheets formed by coating at least one side of a moisture vapor permeable sheet layer with at least one metal layer and at least one thin organic coating layer on the side of the metal layer opposite the sheet layer. The coatings are preferably formed under vacuum using vapor deposition techniques under conditions that substantially coat the sheet layer without significantly reducing its moisture vapor permeability. The composite sheets have high moisture vapor permeability, and good thermal barrier properties. The composite sheets can also be selected to provide a high barrier to intrusion by liquid water (high hydrostatic head), which is also important in construction end uses such as house wrap and roof lining. The balance of properties provided by the composite sheets of the present invention is superior to currently available metalized sheets used in the construction industry. The composite sheets of the present invention provide thin, strong, breathable air and thermal barriers that are suitable for use in existing or new construction. The composite sheets of the present invention, when used as a thermal barrier in wall and/or roof systems, are beneficial in meeting building regulations requiring higher energy efficiency for new construction and renovated buildings.

The composite sheets of the present invention include the following structures: Sheet/M/L2, Sheet/L1/M/L2, and Sheet/L1/M/L2/M/L3, etc. where Sheet is a moisture vapor permeable sheet layer, M is a low emissivity metal layer and L1, L2, and L3 are organic coating layers comprising an organic polymer or organic oligomer, or blends thereof. The abbreviation "L1" is used herein to refer to an optional intermediate organic coating layer that is deposited on a surface of the sheet layer prior to depositing a metal layer thereon. The intermediate coating layer has been found to improve the thermal barrier properties of the composite sheet compared to composite sheets that do not include an intermediate coating layer. The composite sheets include at least one outer organic coating layer overlying the metal layer such as L2 and L3 in the above-described structures. In composite sheet structures having more than one metal layer, individual metal layers can be formed from the same or different metal and can have the same or different thickness. Similarly, in structures having more than one organic coating layer, the individual organic coating layers can have the same or different composition and/or thickness. Each metal layer can comprise more than one adjacent metal layers wherein the adjacent metal layers can be the same or different. Similarly, each organic layer can comprise more than one adjacent organic layer, wherein the adjacent organic layers can be the same or different. The sheet layer can be coated on one side, as in the structures described above, or on both sides such as in the following structures: L2/M/Sheet/M/L2, L2/M/L1/Sheet/L1/M/L2, etc.

In one embodiment of the present invention, one or both sides of the moisture vapor permeable sheet layer comprise a porous outer surface, such as a fibrous surface or a porous film that is coated with the organic and metal layers. The organic and metal layers are deposited on the porous surface such that only the exposed or "outer" surfaces of the fibers or film on the coated side(s) are coated, without covering the pores. This includes the internal surfaces of the walls of the interstitial spaces or pores between the fibers, as well as the fiber surfaces that are exposed when viewed from the outer surface of the sheet layer on the coated side(s); but the surfaces of fibers in the interior structure of the fabric remain uncoated.

Moisture vapor permeable sheet layers suitable for forming the composite sheets of the present invention can have a relatively low air permeability, such as between about 5 and about 12,000 Gurley seconds, even between about 20 and about 12,000 Gurley seconds, even between about 100 and about 12,000 Gurley seconds, and even between about 400 and about 12,000 Gurley seconds, which is generally considered to provide a barrier to air infiltration. Alternately, the moisture vapor permeable sheet layer can be selected to have a relatively high air permeability, for example those sheets having a Gurley Hill air permeability of less than 5 seconds, with the air permeability falling in the Frazier air permeability range. A composite sheet with a relatively high air permeability can have a moisture vapor permeability of at least about 35 g/m$^2$/24 hours, even at least about 200 g/m$^2$/24 hours, even at least about 600 g/m$^2$/24 hours, and a hydrostatic head of at least about 20 cm H$_2$O, even at least about 50 cm H$_2$O, even at least about 100 cm H$_2$O, and even at least about 130 cm H$_2$O. When used as a house wrap, the composite sheet preferably has a tensile strength of at least about 35 N/cm.

Suitable moisture vapor permeable sheet layers are porous sheets, which include woven fabrics, such as sheets of woven fibers or tapes, or nonwoven fabrics, such as flash-spun plexifilamentary sheets, spunbond nonwoven sheets, spunbond-meltblown nonwoven sheets, spunbond-meltblown-spunbond nonwoven sheets, and laminates that include a nonwoven or woven fabric or scrim layer and a moisture vapor permeable film layer, such as a microporous film, a microperforated film or a moisture vapor permeable monolithic film. The starting sheet layer can comprise a moisture vapor permeable sheet that has been coated using conventional coating methods. For example, sheets currently used in the construction industry include sheets of woven tapes that have been coated with a polymeric film layer and microperforated. The sheet layer may be formed from a variety of polymeric compositions. For example, sheets used in the construction industry are typically formed from polyolefins such as polypropylene or high density polyethylene, polyesters, or polyamides.

In one embodiment, the moisture vapor permeable sheet is a flash spun plexifilamentary polyolefin sheet such as Tyvek® flash spun high density polyethylene, available from E. I. du Pont de Nemours and Company, Inc. (Wilmington, Del.). Suitable flash spun plexifilamentary film-fibril materials may also be made from polypropylene. The moisture vapor permeable sheet can be a laminate of a flash spun plexifilamentary sheet with one or more additional layers, such as a laminate comprising a flash spun plexifilamentary sheet and a melt-spun spunbond sheet. Flash spinning processes for forming web layers of plexifilamentary film-fibril strand material are disclosed in U.S. Pat. No. 3,081,519 (Blades et al.), U.S. Pat. No. 3,169,899 (Steuber), U.S. Pat. No. 3,227,784 (Blades et al.), U.S. Pat. No. 3,851,023 (Brethauer et al.), the contents of which are hereby incorporated by reference.

The moisture vapor permeable sheet can be a commercially available house wrap or roof lining product. Flash-spun plexifilamentary sheets used in building construction include Tyvek® SUPRO roof lining, Tyvek® HomeWrap®, Tyvek® CommercialWrap®. Other house wrap products suitable as the moisture vapor permeable sheet layer include AirGuard® Buildingwrap (manufactured by Fabrene, Inc., North Bay, Ontario) which is a woven fabric of high density polyethylene slit film that is coated with white pigmented polyethylene on one side and perforated, Pinkwrap® Housewrap (manufactured by Owens Corning, Toledo, Ohio) which is a woven fabric of polypropylene slit film that is coated on one side and perforated, Pinkwrap Plus® Housewrap (manufactured by Owens Corning, Toledo, Ohio) which is a crossply laminated polyolefin film that is micropunctured and has a corrugated surface, Tuff Wrap® Housewrap (manufactured by Cellotex Corporation, Tampa, Fla.) which is a woven fabric of high density polyethylene film that is coated on one side and perforated, Tuff Weather Wrap® (manufactured by Cellotex Corporation, Tampa, Fla.) which is a polyolefin sheet bonded to a nonwoven scrim that has been embossed to create small dimples on the surface, Greenguard Ultra Amowrap® (manufactured by Amoco, Smyrna, Ga.) which is a woven fabric of polypropylene slit film that is coated on one side and perforated, Weathermate® Plus Housewrap (manufactured by Dow Chemical Company, Midland, Mich.) which is a non-perforated nonwoven membrane that has been coated with a clear coating, and Typar® Housewrap (manufactured by Reemay, Old Hickory, Tenn.) which is a coated spunbond polypropylene sheet.

In some cases it may be desirable to use a moisture vapor permeable sheet layer that is substantially air impermeable. For example, the moisture vapor permeable sheet layer can comprise a laminate of a nonwoven or woven fabric or scrim and a moisture vapor permeable film layer, wherein the moisture vapor permeable film layer is a microporous film or a monolithic film. Generally, one or more moisture vapor permeable film layers are sandwiched between outer nonwoven or woven fabric or scrim layers and the metal and organic coating layers are deposited on at least one of the outer layers such that an outer organic coating layer forms an outside surface of the composite sheet. In one such embodiment, a moisture vapor permeable film layer is sandwiched between two staple fiber nonwoven layers, or two continuous filament nonwoven layers, or two woven fabrics. The outer fabric or scrim layers can be the same or different.

Moisture vapor permeable monolithic (non-porous) films are formed from a polymeric material that can be extruded as a thin, continuous, moisture vapor permeable, and substantially liquid impermeable film. The film layer can be extruded directly onto a first nonwoven or woven substrate layer using conventional extrusion coating methods. Preferably, the monolithic film is no greater than about 3 mil (76 micrometers) thick, even no greater than about 1 mil (25 micrometers) thick, even no greater than about 0.75 mil (19 micrometers) thick, and even no greater than about 0.60 mil (15.2 micrometers) thick. In an extrusion coating process, the extruded layer and substrate layer are generally passed through a nip formed between two rolls (heated or unheated), generally before complete solidification of the film layer, in order to improve the bonding between the layers. A second nonwoven or woven substrate layer can be introduced into the nip on the side of the film opposite the first substrate to form a moisture vapor permeable, substantially air impermeable laminate wherein the monolithic film is sandwiched between the two substrate layers.

Polymeric materials suitable for forming moisture vapor permeable monolithic films include block polyether copolymers such as a block polyether ester copolymers, polyetheramide copolymers, polyurethane copolymers, poly(etherimide) ester copolymers, polyvinyl alcohols, or a combination thereof. Preferred copolyether ester block copolymers are segmented elastomers having soft polyether segments and hard polyester segments, as disclosed in Hagman, U.S. Pat. No. 4,739,012 that is hereby incorporated by reference. Suitable copolyether ester block copolymers include Hytrel® copolyether ester block copolymers sold by E. I. du Pont de Nemours and Company (Wilmington, Del.), and Arnitel® polyether-ester copolymers manufactured by DSM Engineering Plastics, (Heerlen, Netherlands). Suitable copolyether amide polymers are copolyamides available under the name Pebax® from Atochem Inc. of Glen Rock, N.J., USA. Pebax® is a registered trademark of Elf Atochem, S.A. of Paris, France. Suitable polyurethanes are thermoplastic urethanes available under the name Estane® from The B. F. Goodrich Company of Cleveland, Ohio, USA. Suitable copoly(etherimide) esters are described in Hoeschele et al., U.S. Pat. No. 4,868,062. The monolithic film layer can be comprised of multiple layers moisture vapor permeable film layers. Such a film may be co-extruded with layers comprised of one or more of the above-described breathable thermoplastic film materials.

Microporous films are well known in the art, such as those formed from a mixture of a polyolefin (e.g. polyethylene) and fine particulate fillers, which is melt-extruded, cast or blown into a thin film and stretched, either mono- or bi-axially to form irregularly shaped micropores which extend continuously from the top to the bottom surface of the film. U.S. Pat. No. 5,955,175 discloses microporous films, which have nominal pore sizes of about 0.2 micrometer. Microporous films can be laminated between nonwoven or woven layers using methods known in the art such as thermal or adhesive lamination.

Microperforated films are formed by casting or blowing a polymer into a film, followed by mechanically perforating the film, as generally disclosed in European Patent Publication No. EP 1 400 348 A2, which indicates that the microperforations are typically on the order of 0.1 mm to 1.0 mm in diameter.

According to the present invention, the metal and organic coating layers are deposited on a porous sheet using methods that do not substantially reduce the moisture vapor permeability of the sheet. The coatings are deposited over substantially the entire surface of the sheet material while leaving the pore openings of the material substantially uncovered. According to one embodiment of the invention, the moisture vapor permeable sheet layer comprises a fibrous nonwoven or woven fabric. Alternately, the moisture vapor permeable sheet layer can be a fabric-film laminate wherein the fabric comprises an outer surface of the laminate, or the outer surface of the laminate can be a microperforated film. The metal and organic coating layers are deposited on the fabric or microperforated film such that, in the case of a fabric, the exposed surfaces of individual fabric strands on the coated surface of the composite sheet are substantially covered while leaving the interstitial spaces or pores between the strands substantially uncovered by the coating material. By "substantially uncovered" is meant that at least 35% of the interstitial spaces between the fibers are free of coating. In one embodiment, the total combined thickness of the organic coating layers is less than the diameter of the fibers of the nonwoven web. For non-fibrous sheets, at least 35% of the surface pores on the sheet surface are substantially uncovered. This provides a coated composite sheet that has a moisture vapor permeability that is at least about 80%, even at least about 85%, and even at least about 90% of the moisture vapor permeability of the starting sheet material.

When comparing the moisture vapor permeability of a coated composite sheet to the moisture vapor permeability of the uncoated starting sheet, the starting sheet used as the control should be substantially equivalent to the starting sheet material used to make the specific composite sheet for which the moisture vapor permeability is being compared. For example sheet samples from the same roll, lot, etc. used to make the coated sheet should be used to measure the moisture vapor permeability of the starting sheet. A section of the sheet layer can be masked prior to coating so that the masked section is not coated during the coating process, and measurements made on samples taken from adjacent uncoated and coated portions of the sheet. Alternately, uncoated samples can be taken from the beginning and/or the end of a roll of the sheet layer and compared to coated samples made from the same roll.

Since the coatings are discontinuous over the pores, the moisture vapor permeability is not impacted significantly. Vacuum vapor deposition methods known in the art are preferred for depositing the metal and organic coatings. The thickness of the metal and organic coatings are preferably controlled within ranges that provide a composite sheet having an emissivity no greater than about 0.15, even no greater than about 0.12, and even no greater than about 0.10.

The thickness and the composition of the outer organic coating layer is selected such that, in addition to not substantially changing the moisture vapor permeability of the sheet layer, it does not significantly increase the emissivity of the metalized substrate. The outer organic coating layer preferably has a thickness between about 0.2 μm and 2.5 μm, which corresponds to between about 0.15 g/m$^2$ to 1.9 g/m$^2$ of the organic coating material. In one embodiment, the outer coating layer has a thickness between about 0.2 μm and 1.0 μm (about 0.15 g/m$^2$ to 0.76 g/m$^2$), or between about 0.2 μm and 0.6 μm (about 0.15 g/m$^2$ to 0.46 g/m$^2$). When an intermediate coating layer is used, the combined thickness of the intermediate and outer organic layers is preferably no greater than about 2.5 μm, even no greater than about 2.0 μm, even no greater than about 1.5 μm so that the pores on the surface of the moisture vapor permeable sheet are substantially uncovered. In one embodiment, the combined thickness of the intermediate and outer organic coating layers is no greater than about 1.0 μm. For the structure Sheet/L1/M/L2, the intermediate coating layer preferably has a thickness between about 0.02 μm and 2 μm, corresponding to between about 0.015 g/m$^2$ and 1.5 g/m$^2$. In one embodiment, the intermediate coating layer has a thickness between about 0.02 μm and 1 μm (0.015 g/m$^2$ and 0.76 g/m$^2$), or between about 0.02 μm and 0.6 μm (0.015 g/m$^2$ and 0.46 g/m$^2$). When additional metal and organic layers are deposited, the thickness of each organic coating layer is adjusted such that the total combined thickness of all the organic coating layers is no greater than about 2.5 μm, or no greater than about 1.0 μm. If the outer organic coating layer is too thin, it may not protect the metal layer from oxidation, resulting in an increase in emissivity of the composite sheet. If the outer organic coating layer is too thick, the emissivity of the composite sheet can increase, resulting in lower thermal barrier properties.

Figure 2A:
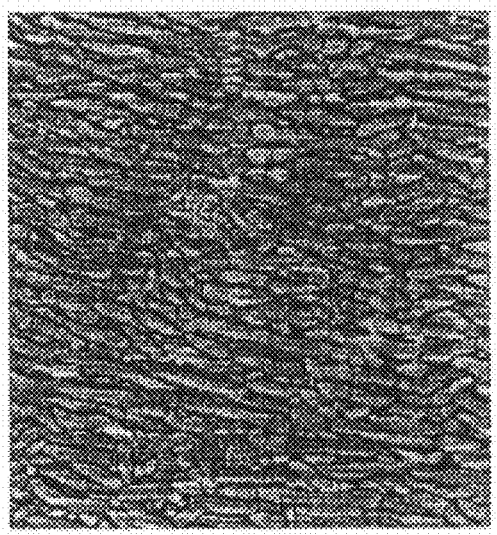
FIGS. 2A and 2B are atomic force micrographs showing the surface features of an uncoated and a polyacrylate-coated high density polyethylene plexifilament, respectively.
Figure 2B:
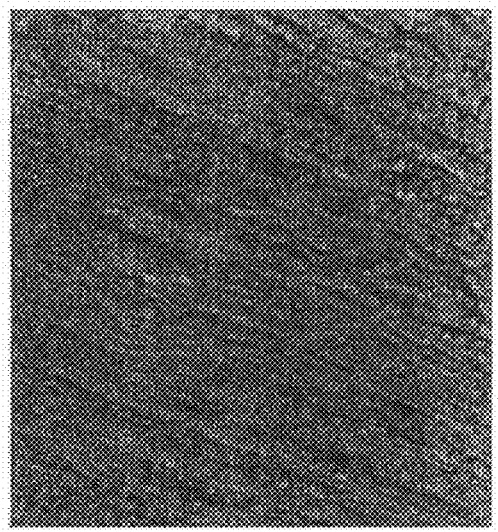

It may be desirable in some cases for the intermediate organic coating layer to be very thin, for example between about 0.02 μm and 0.2 μm (approximately 0.015 g/m$^2$ to 0.15 g/m$^2$). One such example is when the sheet layer comprises a flash spun plexifilamentary or other nonwoven sheet wherein the plexifilaments or fibers have features on their surface that are on the order of 500 nm or less. This is much finer than the surface "macro-roughness" of the nonwoven sheet, where the macro-roughness features are caused by the fibers themselves (peaks and valleys) and gaps between the fibers. FIG. 2A is an atomic force micrograph (AFM) showing the surface features caused by the amorphous areas (dark) and the crystalline lamellae on the surface of a single uncoated high density polyethylene plexifilament. The crystalline lamellae are approximately 25 nm thick and 120 to 450 nm long. It is important that the macro-roughness of the sheet is not significantly altered by metallization and coating, because doing so results in reducing or blocking of the interstitial spaces between the fibers and a reduction in the moisture vapor permeability of the sheet. A very thin polymer layer will smooth the micro-roughness that exists on the surface of the individual fibers without impacting the macro-roughness of the fibrous sheet. In the case of flash spun polyethylene, the coating layer would need to be at least as thick as the lamellar crystallites of polyethylene, which are approximately 25 nm thick. FIG. 2B is an AFM of the surface of a high density polyethylene plexifilament that has been coated with a vapor-deposited layer of polyacrylate polymer approximately 25 nanometers thick. Comparing FIG. 2B to FIG. 2A, it is seen that the surface of the coated plexifilament has been smoothed by the polyacrylate coating, without affecting the macro-roughness of the sheet. In general, an organic coating L1 that is thicker than the average micro-roughness features of a fiber or other surface will result in smoothing of the fiber surface. This smoothing effect may result in a smoother metal layer on the individual fiber surfaces, thereby reducing the emissivity of the composite sheet compared to sheets that do not include L1. For example, an intermediate coating layer L1 having a thickness between about 0.025 μm and 0.2 μm is suitable for flash spun polyethylene sheets.

Suitable compositions for the organic coating layer(s) include polyacrylate polymers and oligomers. The coating material can be a cross-linked compound or composition. Precursor compounds suitable for preparing the organic coating layers include vacuum compatible monomers, oligomers or low MW polymers and combinations thereof. Vacuum compatible monomers, oligomers or low MW polymers should have high enough vapor pressure to evaporate rapidly in the evaporator without undergoing thermal degradation or polymerization, and at the same time should not have a vapor pressure so high as to overwhelm the vacuum system. The ease of evaporation depends on the molecular weight and the intermolecular forces between the monomers, oligomers or polymers. Typically, vacuum compatible monomers, oligomers and low MW polymers useful in this invention can have weight average molecular weights up to approximately 1200. Vacuum compatible monomers used in this invention are preferably radiation polymerizable, either alone or with the aid of a photoinitiator, and include acrylate monomers functionalized with hydroxyl, ether, carboxylic acid, sulfonic acid, ester, amine and other functionalities. The coating material may be a hydrophobic compound or composition. The coating material may be a crosslinkable, hydrophobic and oleophobic fluorinated acrylate polymer or oligomer, according to one preferred embodiment of the invention. Vacuum compatible oligomers or low molecular weight polymers include diacrylates, triacrylates and higher molecular weight acrylates functionalized as described above, aliphatic, alicyclic or aromatic oligomers or polymers and fluorinated acrylate oligomers or polymers. Fluorinated acrylates, which exhibit very low intermolecular interactions, useful in this invention can have weight average molecular weights up to approximately 6000. Preferred acrylates have at least one double bond, and preferably at least two double bonds within the molecule, to provide high-speed polymerization. Examples of acrylates that are useful in the coating of the present invention and average molecular weights of the acrylates are described in U.S. Pat. No. 6,083,628 and WO 98/18852.

Metals suitable for forming the metal layer(s) of the composite sheets of the present invention include aluminum, gold, silver, zinc, tin, lead, copper, and their alloys. The metal alloys can include other metals, so long as the alloy composition provides a low emissivity composite sheet. Each metal layer has a thickness between about 15 nm and 200 nm, or between about 30 nm and 60 nm. In one embodiment, the metal layer comprises aluminum having a thickness between about 15 and 150 nm, or between about 30 and 60 nm. Methods for forming the metal layer are known in the art and include resistive evaporation, electron beam metal vapor deposition, or sputtering. If the metal layer is too thin, the desired thermal barrier properties will not be achieved. If the metal layer is too thick, it can crack and flake off. Generally it is preferred to use the lowest metal thickness that will provide the desired thermal barrier properties. When the composite sheet of the present invention is used as a house wrap or roof lining, the metal layer reflects infrared radiation or emits little infrared radiation, providing a thermal barrier that reduces energy loss and keeps the building cooler in the summer and warmer in the winter.

The thermal barrier properties of a material can be characterized by its emissivity. Emissivity is the ratio of the power per unit area radiated by a surface to that radiated by a black body at the same temperature. A black body therefore has an emissivity of one and a perfect reflector has an emissivity of zero. The lower the emissivity, the higher the thermal barrier properties. Each metal layer and adjacent outer organic coating layer is preferably deposited sequentially under vacuum without exposure to air or oxygen so that there is no substantial oxidation of the metal layer. Polished aluminum has an emissivity between 0.039-0.057, silver between 0.020 and 0.032, and gold between 0.018 and 0.035. A layer of uncoated aluminum generally forms a thin aluminum oxide layer on its surface upon exposure to air and moisture. The thickness of the oxide film increases for a period of several hours with continued exposure to air, after which the oxide layer reaches a thickness that prevents or significantly hinders contact of oxygen with the metal layer, reducing further oxidation. Oxidized aluminum has an emissivity between about 0.20-0.31. By minimizing the degree of oxidation of the aluminum by depositing the outer organic coating layer prior to exposing the aluminum layer to the atmosphere, the emissivity of the composite sheet is significantly improved compared to an unprotected layer of aluminum. The outer organic coating layer also protects the metal from mechanical abrasion during roll handling, transportation and end-use installation.

FIG. 1 is a schematic diagram of an apparatus 10 suitable for vapor-deposition coating of a sheet layer with organic and metal layers under vacuum. In the description that follows, the term monomer is used to refer to vaporizable monomers, oligomers, and low molecular weight polymers. A vacuum chamber 12 is connected to a vacuum pump 14, which evacuates the chamber to the desired pressure. Suitable pressures are between $2\times10^{-4}$ to $2\times10^{-5}$ Torr ($2.66\times10^{-5}$ to $2.66\times10^{-6}$ kPa). Moisture vapor permeable sheet 20 is fed from unwind roll 18 onto a cooled rotating drum 16, which rotates in the direction shown by arrow "A", via guide roll 24. The surface speed of drum 16 is generally in the range of 1 to 1000 cm/second. The sheet passes through several deposition stations after which it is picked off the surface of the rotating drum by guide roller 26 and taken up by wind-up roll 22 as a coated composite sheet. Drum 16 is cooled to a temperature specific to the particular monomer being used to form the organic coating, and can be cooled down to −20° C. to facilitate condensation of the monomer. After unwinding from roll 18, the sheet layer passes through optional plasma treatment unit 36, where the surface of the sheet is exposed to a plasma to remove adsorbed oxygen, moisture, and any low molecular weight species on the surface of the sheet prior to forming the metal or monomer coating thereon. The surface energy of the substrate is generally modified to improve wetting of the surface by the coating layers. The plasma source may be low frequency RF, high frequency RF, DC, or AC. Suitable plasma treatment methods are described in U.S. Pat. No. 6,066,826, WO 99/58757 and WO 99/59185.

An intermediate organic layer is optionally formed on the sheet layer prior to depositing the metal layer. In one embodiment, organic monomer is deposited on the moisture vapor permeable sheet layer by monomer evaporator 28, which is supplied with liquid monomer from a reservoir 40 through an ultrasonic atomizer 42, where, with the aid of heaters (not shown), the monomer liquid is instantly vaporized, i.e., flash vaporized, so as to minimize the opportunity for polymerization or thermal degradation prior to being deposited on the sheet layer. The monomer, oligomer or low molecular weight polymer liquid or slurry is preferably degassed prior to injecting it as a vapor into the vacuum chamber, as described in U.S. Pat. No. 5,547,508, which is hereby incorporated by reference. The specific aspects of the flash evaporation and monomer deposition process are described in detail in U.S. Pat. Nos. 4,842,893; 4,954,371; and 5,032,461, all of which are incorporated herein by reference.

The flash-vaporized monomer condenses on the surface of the sheet and forms a liquid monomer film layer. The monomer coating layer is thin enough that it does not substantially cover the pores of the sheet layer so that the composite sheet has a moisture vapor permeability of at least about 80% of the starting sheet layer. The condensed liquid monomer is solidified within a matter of milliseconds after condensation onto the sheet using a radiation curing means 30. Suitable radiation curing means include electron beam and ultraviolet radiation sources which cure the monomer film layer by causing polymerization or cross-linking of the condensed layer. If an electron beam gun is used, the energy of the electrons should be sufficient to polymerize the coating in its entire thickness as described in U.S. Pat. No. 6,083,628, which is incorporated herein by reference. The polymerization or curing of monomer and oligomer layers is also described in U.S. Pat. Nos. 4,842,893, 4,954,371 and 5,032,461. Alternately, an oligomer or low molecular weight polymer can solidify simultaneously with cooling. For oligomers or low MW polymers that are solid at room temperature, curing may not be required as described in U.S. Pat. No. 6,270,841 that is incorporated herein by reference.

After depositing the intermediate organic layer, the coated sheet layer then passes to metallization system 32, where the metal layer is deposited on the solidified and optionally cured organic layer. When a resistive metal evaporation system is used, the metallization system is continually provided with a source of metal from wire feed 44.

Following the metallization step, the outer organic coating layer is deposited in a similar process as described above for the intermediate polymer layer using evaporator 128, monomer reservoir 140, ultrasonic atomizer 142, and radiation curing means 130. The composition of the outer organic coating layer can be the same or different than the intermediate organic coating layer. Optionally, a metal or organic-coated side of the sheet layer can be plasma treated prior to depositing an additional organic or metal coating layer thereon.

The thickness of the coating is controlled by the line speed and vapor flux of the flash evaporator used in the vapor deposition process. As the coating thickness increases, the energy of the electron beam must be adjusted in order for the electrons to penetrate through the coating and achieve effective polymerization. For example, an electron beam at 10 kV and 120 mA can effectively polymerize acrylate coatings up to 2 μm thick.

If more than one metal layer and/or more than two organic layers are desired, additional flash evaporation apparatuses and metallization stations can be added inside the vacuum chamber. Alternately, a sheet layer can be coated in a first pass in the apparatus shown in FIG. 1, followed by removing the coated sheet and running it in a second pass through the apparatus. Alternately, a separate apparatus can be used for the metallization and organic coating steps. Those of skill in the art will recognize that if it is desired to apply coatings on the reverse side of the sheet layer, a second rotating drum 16 can be added within vacuum chamber 12, with additional plasma treatment units 36, monomer evaporators 28, 128, radiation curing means 30, 130 and metallization system 32, which can be operated independently as desired. Such a dual-drum coating system is illustrated in FIG. 1 of WO 98/18852, which is incorporated herein by reference. It is preferred that an organic coating is deposited on a metal layer prior to removing the coated sheet from the vacuum chamber to prevent significant oxidation of the metal layer. It is most preferred to deposit the organic coating layer(s) and metal layer(s) in a single pass to minimize the processing cost.

The metalized composite sheets of the present invention are especially suitable for use in roof and wall systems in building construction. The highly reflective metalized surface of the composite sheet provides a low emissivity surface that enhances the performance of the insulation and improves the energy efficiency of wall and roof systems, thus reducing fuel costs for the building owner. Additional benefits include minimization of condensation inside wall and roof structures in cold climates and shielding of the building from excessive heat during the summer months. In one embodiment of the present invention, the moisture vapor permeable composite sheet is used in a wall or roof system and has an emissivity of no greater than about 0.15, a moisture vapor permeability of at least about 600 g/m$^2$/24 hr, and a hydrostatic head of at least about 100 cm. The composite sheet is preferably installed in a wall or roof system such that the metalized side is adjacent to an air space. Alternately, the side opposite the metalized side can be adjacent an air space. The distance between the composite sheet and the second surface that forms the air space therebetween is preferably at least about 0.75 inch (1.9 cm). It is believed that installing the metalized composite sheet adjacent an air space maximizes the effectiveness of the composite sheet as a thermal barrier by allowing it to emit little radiant energy or to reflect radiant energy. If the metalized side is in intimate contact over large areas with solid components of the building construction, the energy may be transferred through the building components by conduction, and the effectiveness of the metalized sheet will be reduced. In pitched roof constructions, installing the composite sheet such that the metalized side faces down, towards the attic space also minimizes any reduction in thermal barrier properties that can occur by dust, dirt, etc. accumulation.

Figure 3:
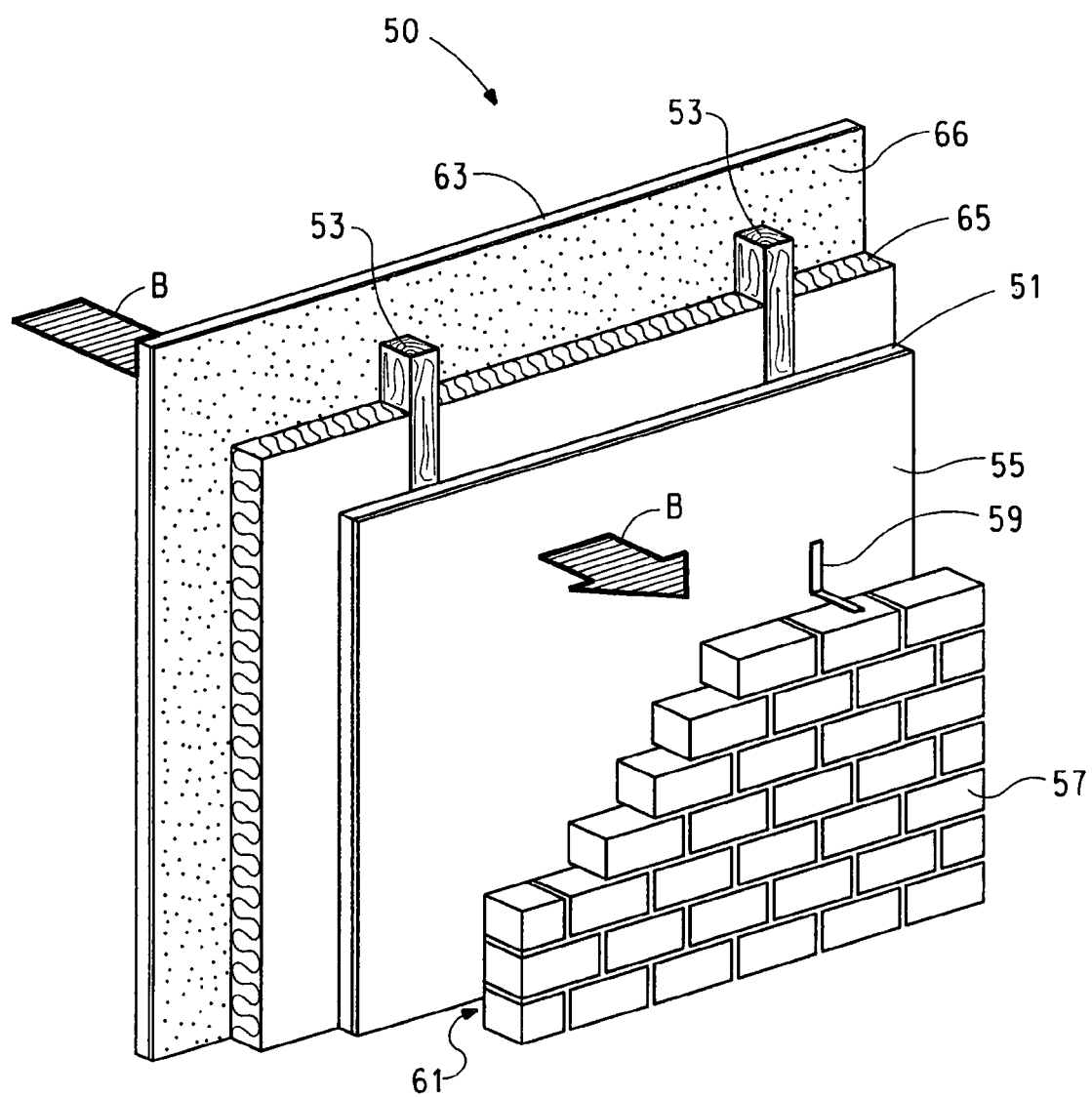
FIG. 3 is a schematic diagram of a wall system according to the present invention.

FIG. 3 is a schematic diagram of a wall system 50 in a frame construction building that utilizes the metalized composite sheet of the present invention as a house wrap. Sheathing layer 51, such as plywood, is attached to the outside of frame elements 53 that form the load-bearing frame of the building. Vertical frame elements 53 are typically formed of wood (e.g. wooden studs) but can be formed of metal in certain constructions. Breathable metalized composite sheet 55 according to the present invention is attached to the outer surface of sheathing 51. In some building constructions, sheathing 51 is not used and the metalized composite sheet 55 is attached directly to frame elements 53. Outer skin 57, which forms the exterior of the building (e.g. brick, concrete block, fiber-reinforced cement, stone, etc.) is separated from the metalized composite sheet by metal straps 59 to form air space 61 therebetween. Wood strips or other spacing members can replace metal straps 59. The metalized composite sheet is preferably installed such that the surface of the composite sheet facing the air space is the metalized side of the sheet. Alternately, the composite sheet can be installed with the metalized side facing away from the air space. Internal lining 63 (e.g. plaster board) forms the interior wall of the building. Insulation 65 is installed in the wall between adjacent frame elements and between the internal lining and the sheathing layers (or between the internal lining and the composite sheet if a sheathing layer is not used). The wall structure optionally includes air leakage barrier and vapor barrier layer 66 intermediate the internal lining and insulation material. Layer 66 protects against convection heat loss and prevents excessive moisture, which is generated in the house, from penetrating into the insulation. The high moisture vapor permeability of the metalized composite sheet allows water vapor to pass through the composite sheet in the direction of arrow "B" where it is dispersed in air space 61, thus preventing moisture condensation in the insulation. For metalized composite sheets having low air permeability and high hydrostatic head, it also protects against wind and water penetration.

Figure 4B:
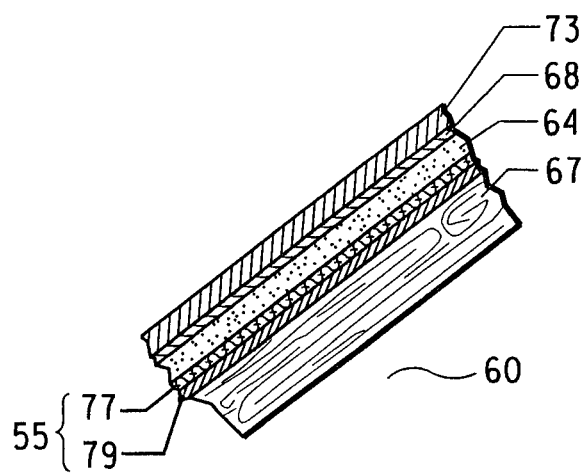
Figure 4C:
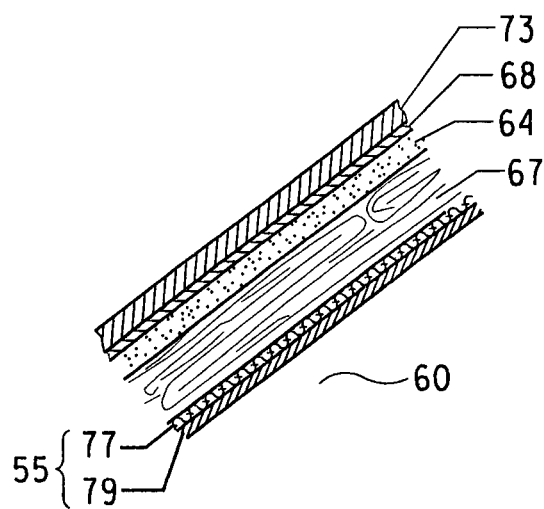

FIGS. 4A-4C are schematic diagrams of roof systems in frame construction buildings that include a metalized composite sheet of the present invention. FIG. 4A illustrates an example of a "cold roof" system in which the interior attic space 60 is not habitable. The metalized composite sheet 55 is installed above pitched roof frame elements (e.g. wooden rafters) 67. Insulation material 65 is installed between attic floor joists (not shown) above and adjacent to the level of interior ceiling 71. Optional vapor barrier 70 can be installed intermediate insulation 65 and interior ceiling 71. Spacing members (battens) 76 are placed adjacent the top surface of the metalized composite sheet and external roofing material 73 (e.g. tiles, etc.) is installed on the spacing elements. There is a batten air space 74 above the metalized composite sheet and between spacing elements (battens) 76 and the external roofing material. The ridge of the roof system is designated by 75. Metalized composite sheet 55 is moisture vapor permeable and includes sheet layer 77 coated with metal and organic coating layers depicted as layer 79. Composite sheet 55 is installed such that the metalized side faces the attic space.

FIG. 4B is a cross-section through a portion of a cold roof system that includes a fully boarded deck instead of a batten system. Metalized composite sheet 55 is installed on top of roof rafters 67, preferably with the metalized side 79 facing down towards the interior attic space 60. A solid roof deck 64 (e.g. plywood) is installed over the metalized composite sheet and the external roofing is installed over the solid decking. Examples of external roofing include asphalt-coated felt or other roofing underlayment material 68 with exterior roofing material 73 such as tiles or asphalt shingles placed over the roofing underlayment. In another embodiment of a fully boarded deck shown in FIG. 4C, the metalized sheet 55 is attached to the underside of the roof rafters 67, with the metalized side 79 preferably facing down towards attic space 60. The composite sheet can be installed with the metalized side 79 facing away from the attic space, however dust and dirt accumulation on the metalized side can result in an increase in emissivity with time and a reduction in thermal barrier properties.

Figure 4D:
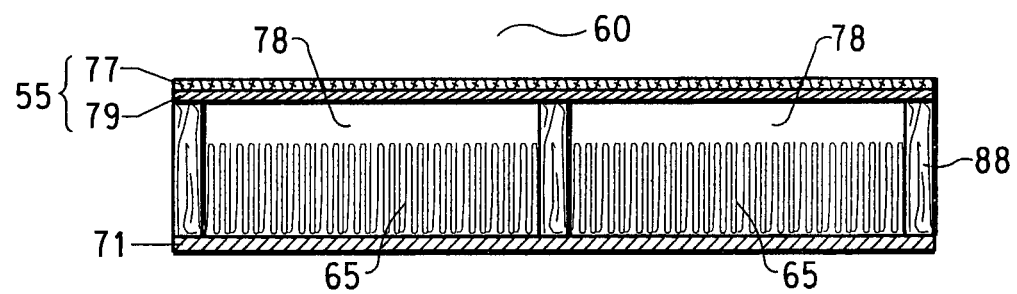
FIG. 4D is a schematic diagram illustrating installation of a metalized composite sheet on the floor joists in an attic.

The metalized composite sheet can also be installed on top of the attic floor joists 88 as shown in FIG. 4D. The composite sheet 55 is preferably installed with the metalized side 79 facing down, away from interior attic space 60 and towards insulation material 65, for the reasons stated above. An air space 78 is preferably provided between the insulation and the metalized composite sheet.

In addition to functioning as a thermal barrier, the metalized composite sheets of the present invention can shield a building from electromagnetic frequency radiation (EMF) when installed as house wrap and/or roof lining. The composite sheet attenuates the incoming and/or outgoing EMF signals so that they cannot be transmitted in or out of the building. While aluminum foil or other metallic sheets could be used, such sheets are not breathable which makes them undesirable as building wraps. Standard house wrap and roof lining installation methods can be used to achieve the benefit of EMF shielding. For the most complete protection, the composite sheet should be installed as a wrap in all the walls and the roof.

Test Methods

In the non-limiting examples that follow, the following test methods were employed to determine various reported characteristics and properties. ASTM refers to the American Society of Testing Materials. ISO refers to the International Standards Organization. TAPPI refers to Technical Association of Pulp and Paper Industry.

For Examples using sheet layers in roll form, three samples (S1, S2, and S3) were taken from the beginning, middle, and end of each roll and multiple measurements made on each of these samples and averaged for hydrostatic head, Gurley Hill Porosity, MVTR, and emissivity measurements.

Basis weight (BW) was determined by ASTM D-3776, which is hereby incorporated by reference and reported in $g/m^2$.

Hydrostatic head (HH) was measured using ISO 811, which is hereby incorporated by reference and is reported in cm of water. This test measures the resistance of a sheet to the penetration of liquid water under a static load. A 100 $cm^2$ sample is mounted in a Shirley Hydrostatic Head Tester (manufactured by Shirley Developments Limited, Stockport, England). Water is pumped against one side of the sample until three points of leakage appear on the surface. The hydrostatic head was measured for a total of 18 samples for each Example and the measurements averaged to obtain the average HH reported in the Examples.

Gurley Hill Porosity is a measure of the barrier of the sheet material for gases. In particular, it is a measure of how long it takes for a volume of gas to pass through an area of material wherein a certain pressure gradient exists. Gurley-Hill porosity is measured in accordance with TAPPI T-460 om-88 using a Lorentzen & Wettre Model 121D Densometer. This test measures the time of which 100 cubic centimeters of air is pushed through a 2.54 cm diameter sample under a pressure of approximately 12.45 cm of water. The result is expressed in seconds and is usually referred to as Gurley Seconds. The Gurley Hill Porosity was measured for a total of 18 samples for each Example and the measurements averaged to obtain the average Gurley Seconds reported in the Examples.

Emissivity is a measure of the heat absorbance and reflectance properties of a material and was measured according to ASTM C1371-98 and ASTM C408-71 using a Model AE D&S Emissometer (manufactured by Devices and Services Company, Dallas, Tex.) with the metalized side of the sheet samples facing the radiation source. The detector was heated to 82° C. and calibrated with standards having a low emissivity (reflective, emissivity=0.07) and high emissivity (absorbing, emissivity=0.89). The instrument was calibrated at the beginning and end of each measurement and at least once every 30 minutes. The emissivity was measured for a total of 27 samples for each Example and the measurements were averaged to obtain the average emissivity reported in the Examples. Three emissivity measurements were obtained from each of three areas, close to both edges and the center of the roll width for each S1, S2, and S3 sample. The same measurements were repeated three times, each time with a new S1, S2, and S3 for a total of 27 emissivity measurements that were averaged to obtain the average emissivity reported in the Examples.

Thermal Resistance ($R_g$) is a measure of heat flow through a single reflective air space that has parallel bounding surfaces ("air cavity") and is calculated from the emissivity according to EN ISO 6946 and reported in units of $m^2$ K/W:

$$R_g = 1/(h_c + h_r),$$

Where, $h_c$: heat transition coefficient (conduction, convection),
$h_r$: heat transition coefficient (radiation)

$$h_r = E h_{ro}$$

$$E = (1/\epsilon_1 + 1/\epsilon_2 - 1)^{-1} \text{ and } h_{ro} = 4\sigma T_m^3$$

E: Emissivity grade
$h_{ro}$: Heat transition coefficient by radiation of a black body
$\sigma$: Stefan-Boltzmann constant ($5.67 \cdot 10^{-8}$ W $m^{-2}$ $K^{-4}$)
$T_m$: average thermodynamic temperature of the surface and its surroundings
horizontal heat transfer: $h_c = 1.25$ W/$m^2$K or $h_c = 0.025/d$, if >1.25 W/$m^2$K
vertical upward heat transfer: $h_c = 1.95$ W/$m^2$K or $h_c = 0.025/d$, if >1.95 W/$m^2$K
d: thickness of air cavity
$\epsilon_1$, $\epsilon_2$=emissivities of the surfaces enclosing the air cavity
In the Examples, $R_g$ is calculated for $T_m = 283°$ K., d=50 mm, $\epsilon_1$=emissivity of the sheet, and $\epsilon_2$=0.9 (emissivity of a brick wall). A thermal conductivity for mineral wool of 0.38 W/mK was used to calculate the equivalent thickness of mineral wool.

Shielding Effectiveness is a measure a material's ability to block electromagnetic frequency (EMF) radiation, reported in units of –dB and is defined as $$\text{Shielding Effectiveness} = -10 \log_{10}(P_T/P_I)$$

Where $P_T$ is the radiated power transmitted through the sample and $P_I$ is the radiated power incident on the sample. A shielding effectiveness of –dB=100 means that the ratio of $P_T/P_I$ has been reduced by a factor of $10^{10}$. $P_T$ and $P_I$ were measured according to ASTM D4935-99 (Standard Test Method for Measuring the Electromagnetic Shielding Effectiveness of Planar Materials) using an Elgal SET 19-A Coaxial Shielding Effectiveness Tester & Hewlett-Packard 8753C Vector Network Analyzer. Measurements were made with the metalized side of the composite sheet facing the signal generator. The shielding effectiveness was calculated using the above formula.

Moisture Vapor Transmission Rate (MVTR) is a measure of the moisture vapor permeability of a material and was measured according to ASTM F1249, which is hereby incorporated by reference, under the conditions of 23° C. and 85% Relative Humidity, and is reported in units of g/$m^2$/24 hr. The MVTR was measured for a total of 9 samples for each Example and the measurements averaged to obtain the average MVTR reported in the Examples.

Tensile strength of a sheet layer is measured according to ASTM D5035-90.

The thickness of vapor deposited organic layers was measured on cryomicrotomed specimens using transmission electron microscopy and is reported in micrometers (μm).

The thickness of metal layers was measured on cryomicrotomed specimens using transmission electron microscopy and is reported in nanometers (nm).

EXAMPLES

The abbreviations defined below are used in the Examples that follow:

Monomer/oligomer compositions:
1. TRPGDA=tripropylene glycol diacrylate
2. SR606=reactive polyester diacrylate
3. SR9003=propoxylated neopentyl glycol diacrylate
4. HDODA20% C18=a mixture of hexanediol diacrylate and stearic acid monoacrylate (80/20 by weight)
5. Zonyl®™/TRPGDA=80/20 by weight Zonyl®™/TRPGDA where Zonyl®™ is a fluorinated methacrylate oligomer TRPGDA, SR606, SR9003, HDODA, and stearic acid monoacrylate are commercially available from Sartomer Company (Exton, Pa.). Zonyl®™ fluorinated methacrylate oligomer is available from E. I. du Pont de Nemours and Company (Wilmington, Del.). The above abbreviations are also used in the Examples for the polyacrylate layer formed by curing the corresponding monomer.

The sheet layers used in Examples 1-8 are listed in Table I and are available from E. I. du Pont de Nemours and Company (Wilmington, Del.).

TABLE I

Sheet Layers Used in Examples

| Sheet layer | BW (g/m²) | Thickness (μm) |
|---|---|---|
| Tyvek ® 1560B HomeWrap ® (HW1) | 61 | 180 |
| Tyvek ® 1580B HomeWrap ® (HW2) | 80 | 216 |
| Tyvek ® 1162B CommercialWrap ® (CW1) | 82 | 180 |
| Tyvek ® Supro ® Rooflining (RF1) | 160 | 500 |
| Tyvek ® Reflex ® 3460M house wrap (HWM1) | 62 | 185 |
| Tyvek ® Reflex ® 3480M house wrap (HWM2) | 84 | 222 |

HW1, HW2, CW1, and RF1 are not metalized. HWM1 and HWM2 are metalized with an aluminum layer and have a composite optical density of 2.5 (approx. 36 nm thick aluminum layer) and coated with a 1.5 g/m² organic lacquer coating using flexographic printing methods.

Example 1

This Example demonstrates that the moisture vapor permeability of moisture permeable nonwoven sheets that have low air permeability is substantially unchanged when the sheet is coated and metalized according to the present invention.

Roll samples (460 m long by 41 cm wide) of HW1, HW2, CW1, and RF1, listed above in Table I, were coated with various polyacrylate layers and metalized with aluminum in a vacuum coating/metallization machine to form the structures listed in Table II (where Al=aluminum and L1, L2, and L3 are diacrylates selected from TRPGDA, SR606, HDODA20% C18, SR9003, and Zonyl®™/TRPGDA). In structures containing more than one polyacrylate layer, the composition of the polyacrylate layers were the same in some Examples and different in others. The Al thickness was either 22 or 36 nm and the polymer layer thickness (L1, L2, L3) was 0.5 μm.

The vacuum chamber of the vacuum coating/metallization machine included a plasma treatment station, one vapor deposition station, and one metallization station. The coated samples were therefore prepared in two or three steps, depending on the number of layers deposited.

In the first step, a roll of uncoated sheet layer was placed in an unwind position in the vacuum chamber, which was open to the atmosphere. After splicing with a polypropylene film leader, the substrate was threaded from the unwind position through the machine to a wind-up position. The vacuum chamber was then closed and evacuated to $10^{-2}$-$10^{-3}$ Torr. The roll was unwound at 91 m/min and one surface of the sheet layer was treated by Ar/N$_2$ (80/20) plasma at 300 W. Immediately after plasma treatment, an aluminum layer was deposited, followed by an acrylate monomer or monomer blend with curing, to form a roll of sheet layer/Al/L2. Alternatively, the acrylate monomer or monomer blend was flash vaporized and condensed onto the plasma-treated surface of the sheet layer. The sheet layer was cooled to between about −15° C. and −20° C. on a cooled drum during deposition of a Zonyl®™/TRPGDA composition. Cooling was not used for the other monomer compositions. The monomer vapor was produced in a flash evaporator located outside of the vacuum chamber and was drawn into the vacuum chamber through a heated pipe and a nozzle slit. Upon contact with the surface of the sheet layer, the monomer vapor condensed into a thin liquid layer that was then cured by an electron beam to obtain an acrylate polymer layer approximately 0.5 μm thick on the surface of the fibers. After curing, the vacuum chamber was vented and the roll of polyacrylate-coated sheet layer (Sheet layer/L1) was removed from the vacuum chamber.

In the second step, the coated roll (Sheet Layer/L1) was placed into the unwind position and the chamber was pumped down to <$10^{-4}$ Torr. The coated sheet was unwound at 91 m/min and the acrylate-coated side was plasma treated as in the first step, followed by vacuum metallization with aluminum and immediately thereafter a second layer 0.5 μm thick of the same or different acrylate or blend was deposited on top of the metal layer and cured to form a coated metalized sheet (Sheet Layer/L1/Al/L2). The sheets were cooled on a cooled drum to between about −15° C. and −20° C. during metallization. Typical monomer feed rates were about 14 g/min. The vacuum chamber was then vented and the roll of coated sheet material removed. For samples having coatings deposited in the configuration Sheet Layer/L1/Al/L2/Al/L3, the second step was repeated to deposit the second layer of aluminum and an outer layer of acrylate polymer L3.

Multiple samples were obtained from the beginning, middle, and end of each roll and properties measured using the test methods described above and compared to their corresponding non-metalized precursor sheets. Property data are reported in Table II below for control samples (sheet layer with no acrylate or metal coating) and samples of the invention having various combinations of metal and acrylate coatings.

TABLE II

Average Properties of Polyacrylate/Metal-Coated Sheets and Non-Metalized Controls

| Sheet Layer | Structure | Gurley (s) | MVTR (g/m²/24 hrs) | HH (cm H$_2$O) | Emissivity |
|---|---|---|---|---|---|
| HW1 | HW1 Control | 164 ± 14 | 1530 ± 45 | 186 ± 12 | 0.64 ± 0.01 |
| | HW1/Al/L2 | 180 ± 51 | 1600 ± 98 | 173 ± 17 | 0.14 ± 0.04 |
| | HW1/L1/Al/L2 | 179 ± 40 | 1540 ± 76 | 167 ± 28 | 0.11 ± 0.02 |
| | HW1/L1/Al/L2/Al/L3 | 178 ± 110 | 1499 ± 274 | 165 ± 1 | 0.11 ± 0.01 |
| HW2 | HW2 Control | 191 ± 19 | 1430 ± 133 | 225 ± 16 | 0.64 ± 0.01 |
| | HW2/L1/Al/L2 | 209 ± 66 | 1470 ± 74 | 181 ± 48 | 0.10 ± 0.02 |
| | HW2/L1/Al/L2/Al/L3 | 165 ± 82 | 1560 ± 148 | 190 ± 20 | 0.11 ± 0.01 |

TABLE II-continued

Average Properties of Polyacrylate/Metal-Coated Sheets and Non-Metalized Controls

| Sheet Layer | Structure | Gurley (s) | MVTR (g/m²/24 hrs) | HH (cm H₂O) | Emissivity |
|---|---|---|---|---|---|
| CW1 | CW1 Control | 3670 ± 888 | 1005 ± 98 | 434 ± 47 | 0.65 ± 0.06 |
|  | CW1/L1/Al/L2 | 3343 ± 792 | 1041 ± 23 | 428 ± 12 | 0.10 ± 0.01 |
| RF1 | RF1 Control | 882 ± 220 | 1588 ± 106 | 297 ± 21 | 0.62 ± 0.01 |
|  | RF1*/L1/Al/L2 | 639 ± 61 | 1651 ± 90 | 285 ± 13 | 0.13 ± 0.01 |

*RF1 is a laminate of flash spun polyethylene and spunbond polypropylene. RF1 was coated on the flash spun side of the laminate.

The data in Table II demonstrate that the air permeability, moisture vapor permeability, and hydrostatic head of the samples prepared according to the present invention (Sheet Layer/Al/L2, Sheet Layer/L1/Al/L2, and Sheet Layer/L1/Al/L2/Al/L3) were substantially unchanged compared to the starting sheet layer. The coated/metalized samples of the invention provide significantly better thermal resistance (lower emissivity) than the starting sheet layer without significantly impacting the sheet's other properties that are important in construction end uses such as house wrap and roof lining. These observations were independent of the acrylate monomers used. Other properties that were measured and not reported in Table II were tensile strength (machine direction and cross-direction), Mullen burst, Elmendorf, and nail tear, which were in all cases found to be within the range of normal variation of the controls.

Example 2 and Comparative Example 2

This Example compares coated metalized sheets of the present invention suitable for use as house wrap to Tyvek® Reflex® house wrap, an incumbent commercial metalized house wrap.

Examples 2a, 2b, and 2c were coated with polyacrylate and metalized with aluminum as described above for Example 1, using HW1 as the starting sheet layer for Examples 2a and 2b and HW2 as the starting sheet layer for Example 2c, to provide the structures shown in Table III. Comparative Examples 2a and 2b are commercial metalized house wrap Reflex® 3460M and Reflex® 3480M, respectively.

parative Example 2b (having an organic coating covering the metal layer which also covers the interstitial spaces between the fibers of the sheet layer) have reduced MVTR (approximately 33% and 37% reduction, respectively), reduced Gurley Hill porosity (approximately 64% and 156%, respectively) compared to control samples HW1 and HW2. The Examples of the invention and the Comparative Examples have hydrostatic heads that are not significantly changed compared to the control samples.

In addition to significantly higher MVTR compared to the commercial metalized house wrap samples, the examples of the invention have approximately 40-50% lower emissivity, corresponding to an improvement in thermal resistance of the air cavity in combination with the composite sheet of about 19-38% compared to the commercial metalized house wrap products. This corresponds to a 29-38% improvement in equivalent thickness of mineral wool insulation. The very thin metal and organic coating layers of the composite moisture vapor permeable sheet layers of the present invention provided an improvement in insulating properties equivalent to 19-22 mm of mineral wool insulation, compared to 16-17 mm for the incumbent HWM1 and HWM2 (Reflex®) materials.

Example 3

This example shows the impact of using an intermediate polymer coating (L1) between the sheet layer and the metal layer on the emissivity of metalized sheets prepared according to the present invention.

TABLE III

Average Properties of Polyacrylate/Metal-Coated Sheets and Non-Metalized Controls

| Example | Structure | Gurley (s) | MVTR (g/m²/24 hrs) | HH (cm H₂O) | Emissivity | Thermal Resistance (m² K/W) | Equivalent Thickness of Mineral Wool (mm) |
|---|---|---|---|---|---|---|---|
|  | HW1 Control | 164 ± 14 | 1530 ± 45 | 186 ± 12 | 0.64 ± 0.012 | 0.23 | 8 |
| Ex. 2a | HW1/Al/L2 | 180 ± 51 | 1600 ± 98 | 173 ± 17 | 0.14 ± 0.04 | 0.50 | 19 |
| Ex. 2b | HW1/L1/Al/L2 | 179 ± 40 | 1540 ± 76 | 167 ± 28 | 0.11 ± 0.02 | 0.58 | 22 |
| Comp. Ex. 2a | HWM1 = HW1/Al/polymer coating | 269 ± 31 | 1030 ± 150 | 135 ± 13 | 0.23 ± 0.02 | 0.42 | 16 |
|  | HW2 Control | 191 ± 19 | 1430 ± 133 | 225 ± 16 | 0.64 ± 0.01 | 0.23 | 8 |
| Ex. 2c | HW2/L1/Al/L2 | 209 ± 66 | 1470 ± 74 | 181 ± 48 | 0.10 ± 0.02 | 0.59 | 22 |
| Comp. Ex. 2b | HWM2 = HW2/Al/polymer coating | 490 ± 85 | 900 ± 23 | 204 ± 9 | 0.18 ± 0.02 | 0.45 | 17 |

The data in Table III illustrate that the samples of the invention (Examples 2a-2c) have substantially the same Gurley Hill porosity, moisture vapor transmission rate and hydrostatic head as the control samples HW1 and HW2, while the metalized samples of Comparative Example 2a and Com- Samples of CW1 house wrap measuring 30.5 cm×30.5 cm were coated and/or metalized using separate metalizer and vacuum flash evaporation machines so that, after metallization or polymer deposition, the samples were exposed to air during transfer from one machine to the other. The samples were plasma treated as described in Example 1. Metalized samples were formed having different metal layer thicknesses of 10, 50, and 100 nm using gold or aluminum metal. The thickness of the polyacrylate layer was approximately 0.5 μm. After polymer deposition and/or metallization, the emissivity was measured in multiple locations throughout the sample area. The structures and their properties are shown in Table IV below.

TABLE IV

Comparison of Emissivity for Metalized Sheets With and Without an Intermediate Polyacrylate Layer

| | Thickness of Metal Layer (nm) | | |
|---|---|---|---|
| | 10 | 50 | 100 |
| Emissivity: CW1/Au | 0.43 ± 0.02 | 0.21 ± 0.01 | 0.19 ± 0.02 |
| Emissivity: CW1/SR606/Au | 0.24 ± 0.02 | 0.10 ± 0.01 | 0.09 ± 0.001 |
| Emissivity: CW1/Al | 0.81 ± 0.01 | 0.31 ± 0.01 | 0.19 ± 0.01 |
| Emissivity: CW1/SR606/Al | 0.84 ± 0.01 | 0.18 ± 0.02 | 0.09 ± 0.01 |

The data in Table IV show that the samples having a polyacrylate layer intermediate the sheet layer and the metal layer have significantly lower emissivities than the corresponding samples having the same sheet layer and metal layer thickness with no intermediate polyacrylate coating. It is believed that the 0.5 μm thick polymer layer smoothes the micro-roughness the surface of the fibers in the sheet layer, thereby improving its emissivity.

Example 4

This Example demonstrates the impact of an outer polyacrylate coating layer (L2) on emissivity of metalized sheets.

Coated metalized sheet samples (30.5 cm×30.5 cm) were prepared as described in Example 3. Both samples were prepared during the same coating run with SR606 followed by the same metallization run with aluminum to ensure that the thicknesses of the metal and polymer coating layers were substantially the same for all samples. The structure of the coated samples and emissivities are shown in Table V below.

TABLE V

Emissivity of Metalized Sheets With and Without an Outside Layer of Polyacrylate

| Coated Sheet Structure | Emissivity |
|---|---|
| CW1/SR606 (0.5 μm)/Al (50 nm) | 0.18 ± 0.02 |
| CW1/SR606 (0.5 μm)/Al (50 nm)/SR606 (0.5 μm) | 0.14 ± 0.0001 |

The data in Table V show that samples with L2 have lower emissivity when compared to samples made in the same metallization and coating runs but without L2.

Example 5

This Example demonstrates the impact of the particular diacrylate composition of the outer coating layer on the emissivity of the metalized sheet.

Coated roll samples having the structure Sheet Layer/L1/Al/L2 were prepared with various polyacrylate compositions as L1 and L2 using the method described above in Example 1. The intermediate and outer polyacrylate layers had a thickness of 0.5 μm and the thickness of the aluminum layer was 36 nm. L1=L2 when the acrylate composition was TRPGDA, SR606, SR9003. When L2 was Zonyl®™/TRPGDA, L1 was SR606 and SR9003.

Table VI compares the emissivity of the samples vs. the type of diacrylate used as L2.

TABLE VI

Emissivity of Substrate/L1/Me/L2 for Different L2 Polyacrylate Compositions

| Sheet Layer | L2 | Emissivity Average |
|---|---|---|
| HW1 | TRPGDA | 0.12 ± 0.02 |
| | SR606 | 0.10 ± 0.02 |
| | SR9003 | 0.09 ± 0.01 |
| | Zonyl ® TM/TRPGDA | 0.09 ± 0.01 |
| HW2 | TRPGDA | 0.11 ± 0.01 |
| | SR606 | 0.11 ± 0.03 |
| | SR9003 | 0.10 ± 0.01 |
| | HDODA - 20% C18 | 0.12 ± 0.02 |
| | Zonyl ® TM/TRPGDA | 0.08 ± 0.01 |

The data in Table VI show that the choice of diacrylate used in the outer polymer layer (L2) plays a role in determining the emissivity of the coated sheet. The best performance in emissivity was observed with SR9003 and Zonyl®™/TRPGDA (80/20). Emissivities were 0.10 or below when L2=SR9003, but they were consistently less than 0.10 when L2=Zonyl®™/TRPGDA (80/20). It is believed that the chemical structure of the acrylate in L2 and the thickness of L2 affect the emissivity by its absorption in near IR, IR and far IR regions where emissivity is measured. Fluorocarbons appear to absorb less in the near IR region when compared to hydrocarbons because the overtones of the hydrocarbon C—H bonds are in that region, and are stronger in intensity.

Example 6

This Example demonstrates the impact of carrying out both the vacuum metallization and the vacuum deposition of the outer polymer layer L2 under vacuum without exposing the metal layer to the atmosphere before depositing L2.

Vacuum-coated metalized samples 30.5 cm×30.5 cm were prepared with intermediate and outer polyacrylate layers having a thickness of 0.5 μm, and 50 nm thick aluminum layer deposited over the intermediate polyacrylate layer. The polyacrylate monomer was SR606. Samples having the structures detailed in Table VII were prepared. Each structure was prepared by two different methods. The samples that were exposed to air were prepared in three steps as described in Example 3. The aluminum layer was exposed to air for several hours prior to coating with the outer polyacrylate layer so that an aluminum oxide layer was allowed to form on the aluminum surface. The samples having an aluminum layer that was not exposed to air was carried out in two steps as described in Example 1, so that the aluminum layer and the outer polyacrylate layer were deposited in the same vacuum chamber without venting the chamber in between the metal and monomer deposition/curing steps. The aluminum layer of these samples was not exposed to air, therefore aluminum oxide could only form by oxygen and moisture diffusion through L1 or L2, if at all.

TABLE VII

Emissivity of Polyacrylate Coated Metalized Sheets With and Without Exposure to Air During Metallization/Polymer Deposition

|  | Emissivity |
|---|---|
| Samples Exposed to Air |  |
| CW1/SR606/Al/SR606 | 0.14 +/− 0.0001 |
| Samples Not Exposed to Air |  |
| CW1/SR606/Al/SR606 | 0.10 +/− 0.01 |
| HW1 or HW2/SR606/Al/SR606 | 0.10 +/− 0.01 |

The data in Table VII demonstrate that performing the coating and metallization steps in vacuum without exposing the metalized sample to air prior to depositing the organic coating provides metalized sheets having lower emissivity (improved thermal barrier). It is believed that this is achieved by preventing substantial oxide formation on the metal surface.

Examples 7 and 8

These examples demonstrate the improved shielding effectiveness to electromagnetic frequencies of metalized composite sheets of the present invention.

Figure 5:
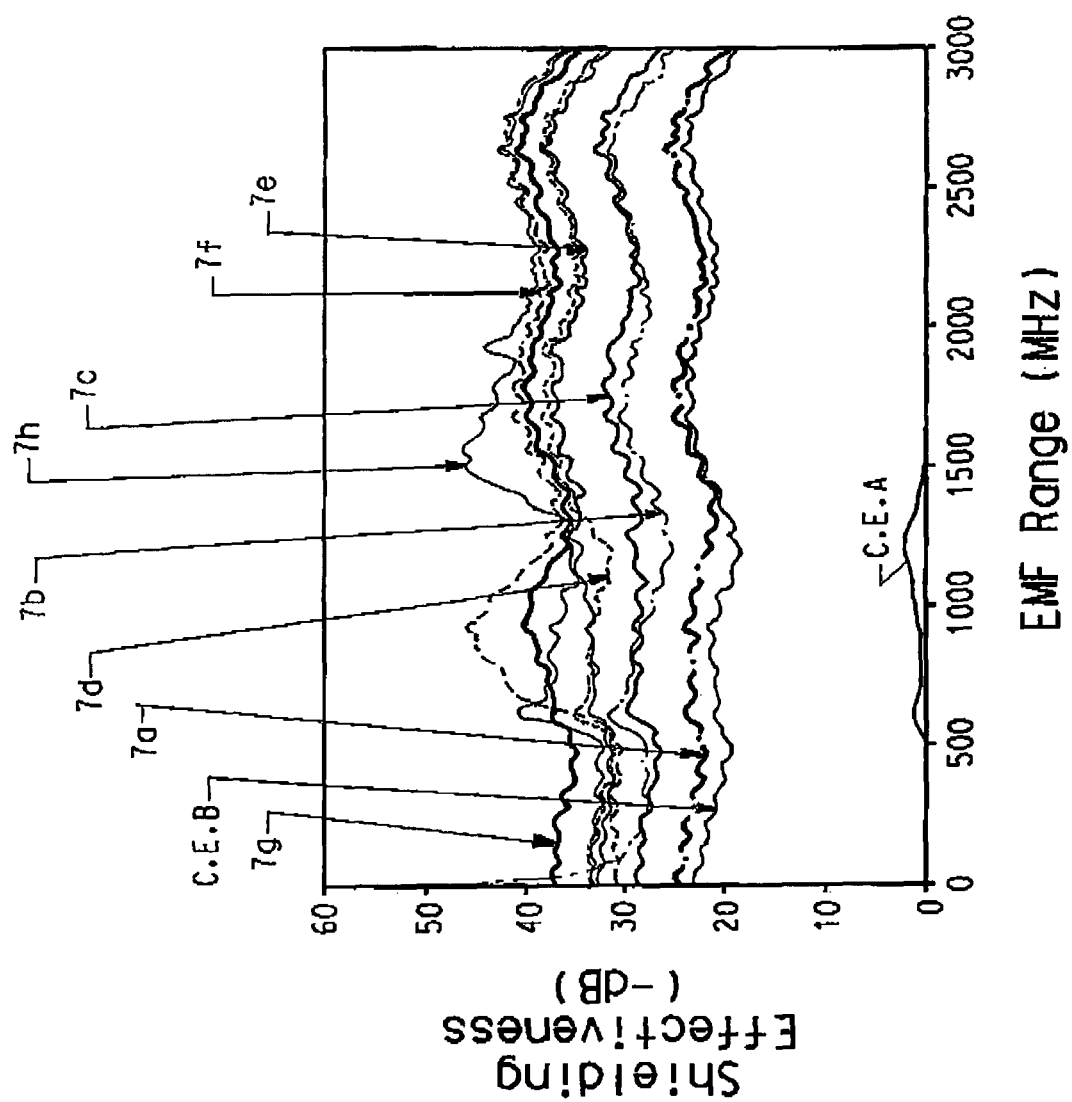
FIG. 5 is a plot of shielding effectiveness versus EMF frequency for composite sheets of Example 7 and incumbent metalized and unmetalized house wraps.

All samples were prepared according to Example 1 with an aluminum thickness of 22 or 36 nm as noted by the structures indicated in FIGS. 5 and 6. The thickness of the intermediate and outer polyacrylate layers was 0.5 micrometers. FIG. 5 is a plot of the EMF shielding effectiveness versus EMF frequency for metalized and coated HW1 materials of the present invention, HW1, and HWM1. FIG. 6 is a plot of the EMF shielding effectiveness versus EMF frequency for metalized and coated HW2 materials of the present invention, HW2, and HWM2.

The non-metalized HW1 and HW2 samples are substantially transparent to EMF radiation and therefore provide no EMF shielding. The metalized composite sheets of the present invention exhibit a considerable improvement in shielding effectiveness of about 20-45 dB, which corresponds to 100 to 32,000 times more shielding than HW1 and HW2. The incumbent metalized sheets HWM1 and HWM2 also provide shielding to EMF radiation but are less effective than the composite sheets of the present invention. Samples with thicker metal layers provided the highest degree of shielding, with the structures HW1/SR606/Al(36 nm)/SR606/Al(36 nm)/SR606 and HW2/SR606/Al(36 nm)/SR606/Al(36 nm)/SR606 providing approximately 50 dB of shielding effectiveness or 100,000 times more shielding than the non-metalized controls.

Surprisingly, samples that include an intermediate organic coating layer (L1) generally provide better shielding than samples that do not include an intermediate coating layer. A continuous 768 μm thick aluminum foil layer (FIG. 6) provides the best shielding effectiveness of approximately 100 dB, however it does not have the breathability of the composite sheets of the present invention.

Example 9

This example demonstrates preparation of metalized composite sheets of the present invention using a variety of house wrap products as the starting moisture vapor permeable sheet layer.

Commercial house wrap products that were used as the moisture vapor permeable sheet layer were: Pinkwrap® Housewrap (manufactured by Owens Corning, Toledo, Ohio), Greenguard Ultra Amowrap (manufactured by Amoco, Smyrna, Ga.), Typar® Housewrap (manufactured by Reemay, Old Hickory, Tenn.), and Weathermate® Plus Housewrap (manufactured by Dow Chemical Company, Midland, Mich.).

House wrap samples having dimensions approximately 2 ft by 4 ft (0.61 m×1.22 m) were metalized and coated using the method described in Example 1. The structure for the metalized and coated samples was Sheet/L1/Al/L2, where organic coating layers L1 and L2 were prepared using SR9003 monomer, each having a coating thickness of 0.5 μm. The aluminum layer was approximately 36 nm thick.

Emissivity, moisture vapor permeability and air permeability are reported in Table VIII. The control samples are the uncoated house wrap sheets.

TABLE VIII

Competitive Properties before and after Metallization

| Sample | Structure | Gurley (s) | MVTR (g/m2/ 24 hrs) | Emissivity |
|---|---|---|---|---|
| Pinkwrap ® | Control | 7 ± 4 | 670 | 0.91 ± 0.01 |
|  | Pink Wrap/L1/Al/L2 | 3 ± 1 | 822 | 0.07 ± 0.02 |
| Typar ® Housewrap | Control | >8000* | 317 | 0.79 ± 0.01 |
|  | Typar/L1/Al/L2 | >8000* | 377 | 0.10 ± 0.01 |
| Greenguard Ultra Amowrap | Control | 301 ± 55 | 1502 | 0.83 ± 0.02 |
|  | Green Guard/L1/Al/L2 | 214 ± 21 | 1248 | 0.14 ± 0.01 |
| Weathermate ® Plus | Control | >8000* | 110 | 0.75 ± 0.03 |
|  | Weather Mate/L1/Al/L2 | >8000* | 100 | 0.09 ± 0.01 |

*Test was stopped at 8000 seconds; materials are nearly air impermeable.

The data in Table VIII demonstrate that MVTR is not significantly changed by the metal and organic coatings compared to the starting house wrap. The emissivity of the metalized samples improved by 83-92% compared to the controls.

What is claimed is:

1. A metalized composite sheet consisting of:
a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics; and at least one multi-layer coating on said first outer surface of the sheet layer, said multi-layer coating comprising:
an intermediate organic coating layer of a composition containing a material selected from the group consisting of organic polymers, organic oligomers and combinations thereof, having a thickness between 0.02 micrometer and 0.5 micrometers deposited on the first outer surface of the moisture vapor permeable sheet layer;
a first metal coating layer having a thickness between about 15 nanometers and 200 nanometers deposited on said intermediate organic coating layer; and
an outer organic coating layer of a composition containing a material selected from the group consisting of organic polymers, organic oligomers and combinations thereof, having a thickness between 0.2 micrometer and 0.5 micrometers deposited on the metal layer; and wherein the MVTR of the composite sheet is at least about 80% of the MVTR of the sheet layer measured prior to depositing the metal and coating layers.

2. The metalized composite sheet of claim 1, wherein the multi-layer coating substantially covers the outer surfaces of the porous sheet while leaving the pores substantially uncovered.

3. The metalized composite sheet of claim 1, which has a hydrostatic head of at least about 20 cm $H_2O$ and a MVTR of at least about 35 g/m$^2$/24 hr.

4. The metalized composite sheet of claim 1, which has an emissivity of no greater than about 0.12.

5. The metalized composite sheet of claim 1, wherein the metal is selected from the group consisting of aluminum, silver, copper, gold, tin, zinc, and their alloys.

6. The metalized composite sheet of claim 5, wherein the metal is aluminum.

7. The metalized composite sheet of claim 1, wherein the moisture vapor permeable sheet layer comprises a nonwoven fabric.

8. The metalized composite sheet of claim 1, wherein the moisture vapor permeable sheet is a nonwoven fabric selected from the group consisting of spunbond fabrics, spunbond-meltblown fabrics, spunbond-meltblown-spunbond fabrics, flash spun plexifilamentary sheets, and composites thereof.

9. The metalized composite sheet of claim 1, wherein the first side of said moisture vapor permeable sheet layer is a perforated film.

10. The metalized composite sheet of claim 1, wherein the moisture vapor permeable sheet layer comprises a woven fabric of woven tapes.

11. The metalized composite sheet of claim 1, wherein the moisture vapor permeable sheet is selected from the group consisting of nonwoven fabric-film laminates and woven fabric-film laminates, and the film is selected from the group consisting of microporous films, perforated films and non-porous moisture vapor permeable films.

12. The metalized composite sheet of claim 1, wherein the outer organic coating layer comprises a cross-linked polyacrylate.

13. The metalized composite sheet of claim 1, wherein the intermediate and outer organic coating layers each comprise a cross-linked polyacrylate.

14. The metalized composite sheet of claim 8, wherein the moisture vapor permeable sheet layer comprises a flash spun plexifilamentary sheet.

15. The metalized composite sheet of claim 14, wherein the flash spun plexifilamentary sheet is laminated to a spunbonded nonwoven fabric and the multi-layer coating is deposited on the flash spun sheet.

16. The metalized composite sheet of claim 1, wherein the outer organic coating layer comprises a fluorinated acrylate oligomer.

17. A metalized composite sheet consisting of:
a porous flash spun plexifilamentary sheet layer having first and second outer surfaces and at least one multi-layer coating comprising:
an intermediate organic coating layer of a composition containing a cross-linked polyacrylate having a thickness between 0.02 micrometer and 0.5 micrometer deposited on the first outer surface of said flash spun plexifilamentary sheet layer;
a metal coating layer having a thickness between about 15 nanometers and 200 nanometers deposited on said intermediate organic coating layer, said metal selected from the group consisting of aluminum, silver, copper, gold, tin, zinc, and their alloys; and
an outer organic coating layer of a composition containing a cross-linked polyacrylate having a thickness between 0.2 micrometer and 0.5 micrometer deposited on the metal layer;
wherein the multi-layer coating substantially covers the outer surface of the flash spun plexifilamentary sheet while leaving the pores substantially uncovered.

18. The metalized composite sheet of claim 17, wherein the intermediate coating layer has a thickness between about 0.025 micrometer and 0.2 micrometer.

\* \* \* \* \*